(12) United States Patent
Shiba et al.

(10) Patent No.: US 7,575,851 B2
(45) Date of Patent: Aug. 18, 2009

(54) CATIONIC PHOTOPOLYMERIZABLE EPOXY RESIN COMPOSITION, MINUTE STRUCTURAL MEMBER USING THE SAME AND METHOD FOR MANUFACTURING MINUTE STRUCTURAL MEMBER

(75) Inventors: Shoji Shiba, Kawasaki (JP); Maki Hatta, Tokyo (JP); Etsuko Hino, Kawasaki (JP); Hiroe Ishikura, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 224 days.

(21) Appl. No.: 11/568,036

(22) PCT Filed: Jun. 24, 2005

(86) PCT No.: PCT/JP2005/012164

§ 371 (c)(1),
(2), (4) Date: Oct. 18, 2006

(87) PCT Pub. No.: WO2006/001518

PCT Pub. Date: Jan. 5, 2006

(65) Prior Publication Data

US 2008/0008971 A1 Jan. 10, 2008

(30) Foreign Application Priority Data

Jun. 28, 2004 (JP) ............................. 2004-190478

(51) Int. Cl.
*G03F 7/038* (2006.01)
(52) U.S. Cl. ...................... 430/280.1; 430/325; 430/18; 522/170; 522/166
(58) Field of Classification Search ....................... None
See application file for complete search history.

(56) References Cited

U.S. PATENT DOCUMENTS

| | | | |
|---|---|---|---|
| 4,565,859 A | 1/1986 | Murai et al. | |
| 5,478,606 A | 12/1995 | Ohkuma et al. | |
| 5,580,695 A | 12/1996 | Murata et al. | |
| 5,756,780 A | 5/1998 | Ohyama et al. | |
| 5,981,139 A | 11/1999 | Tomo | |
| 6,455,112 B1 | 9/2002 | Ohkuma et al. | |
| 6,645,696 B1 * | 11/2003 | Simison et al. | 430/280.1 |
| 7,055,938 B1 | 6/2006 | Ohkuma et al. | |
| 2006/0172222 A1 | 8/2006 | Sakai et al. | |

FOREIGN PATENT DOCUMENTS

| | | |
|---|---|---|
| EP | 0 558 280 A1 * | 2/1992 |
| EP | 0 609 862 A2 | 8/1994 |
| EP | 0 738 603 A2 | 10/1996 |
| JP | 60-161973 A | 8/1985 |

(Continued)

OTHER PUBLICATIONS

English translation of JP, 05-127369 A (1993) from machine translation from AIPN Japan Patent Office Natinal center for Industrial Property Information and Training, generated Sep. 30, 2008, 3 pages.*

J. V.Crivello et al., "Diaryliodonium Salts as Thermal Initiators of Cationic Polymerization," 27 J. Polym. Sci. 97-109 (1983).

*Primary Examiner*—Cynthia Hamilton
(74) *Attorney, Agent, or Firm*—Fitzpatrick, Cella, Harper & Scinto

(57) ABSTRACT

A cationic photopolymerizable epoxy resin composition includes an epoxy resin, a cationic photopolymerization initiator, an inhibitor of cationic polymerization and a compound that has a fluoroalkyl group and also has a substituent at its terminal, with the substituent being allowed to cross-link react with the epoxy group of the epoxy resin. The cationic photopolymerizable epoxy resin composition further includes a thermal cationic polymerization catalyst.

17 Claims, 2 Drawing Sheets

FOREIGN PATENT DOCUMENTS

| | | |
|---|---|---|
| JP | 63-221121 A | 9/1988 |
| JP | 64-9216 A | 1/1989 |
| JP | 2-140219 A | 5/1990 |
| JP | 5-127369 A | 5/1993 |
| JP | 5-232706 A | 9/1993 |
| JP | 8-290572 A | 11/1996 |
| JP | 9-77757 A | 3/1997 |
| JP | 3143307 B | 12/2000 |
| JP | 3143308 B | 12/2000 |
| JP | 9-325496 A | 7/2007 |
| WO | 02/097002 A1 | 12/2002 |
| WO | 2004/023213 A1 | 3/2004 |

* cited by examiner

CATIONIC PHOTOPOLYMERIZABLE EPOXY RESIN COMPOSITION, MINUTE STRUCTURAL MEMBER USING THE SAME AND METHOD FOR MANUFACTURING MINUTE STRUCTURAL MEMBER

TECHNICAL FIELD

The present invention relates to an epoxy resin composition, and more particularly concerns a cationic photopolymerizable epoxy resin composition that is preferably used for forming a minute structural member, such as an ink jet head on a substrate to be processed, by using a photolithographic process. The present invention also relates to a minute structural member using such an epoxy resin composition and a method for manufacturing such a minute structural member.

BACKGROUND ART

In recent years, along with the developments in science and technology, there has been a strong demand for minute structural members in various fields, and related research has been vigorously conducted with respect to devices such as microactuators, electronic devices and optical devices. For example, various small-size sensors, microprobes, thin-film magnetic heads, ink jet heads and the like have been put into practical use. With respect to the method for manufacturing such a minute structural member, various methods, such as a stamper, dry etching and photolithography, have been used. Among these methods, pattern formation though photolithography using a photosensitive resin material has advantages in that a desired shape with a high aspect ratio is easily obtained with a high level of precision. The resist to be used for photolithography is mainly classified as a negative type resist or a positive type resist. In particular, when such a structural member that is used as a part on a substrate is formed, the negative type resist is mainly desirable for use. Moreover, from a viewpoint of the purpose of use, when the minute structural member requires anti-chemical properties and when the minute structural member needs to be used with a comparatively thick film thickness in a range from several microns to several tens of microns, a cationic polymerizable resin material using an epoxy resin, a vinyl ether compound or the like as its base is generally used.

In general, when a minute structural member is formed by using an epoxy-based photosensitive resin material, a cationic polymerizable epoxy resin or an epoxy oligomer, or cationic photopolymerizable epoxy resin composition made from a cationic photopolymerization initiator, such as a photoacid generator, is used. In such a cationic photopolymerizable epoxy resin composition, an acid is generated by exposure, and the ring-opening polymerization of the epoxy group advances by using the acid as a catalyst through a heating process after exposure (PEB). In this case, the patterning property tends to be adversely effected by various environmental factors such as diffusion of the acid to an unexposed portion, basic components in the air and the state of the face with which the resin is made in contact. For this reason, in an attempt to form a further minute pattern, degradation in the resolution and size-controlling property tends to occur.

For example, with respect to a negative type resist of a chemical amplifying type, in order to solve problems similar to the problem described above, a method in which, for example, a substance having a function for deactivating acid is preliminarily contained in resist has been proposed in order to prevent the acid generated in the exposed portion from diffusing beyond the necessary degree (Japanese Patent Application Laid-Open No. H05-127369, Japanese Patent Application Laid-Open No. H05-232706, Japanese Patent Application Laid-Open No. H09-325496).

In the field of ink jet heads, in general, the head is always made in contact with ink (that is, in general, ink that is mainly composed of water, and is not neutral) during its use. Therefore, in the case of a head with a large recording width, there have been strong demands for a material with a low water absorption, which is superior in anti-ink properties, mechanical properties and adhesion to the substrate, as the constituent member for the ink jet head. In order to solve the above-mentioned problems, in Japanese Patent Application Laid-Open No. H08-290572, the applicant of the present invention has disclosed a method for manufacturing an ink jet head in which the constituent member of the ink jet head is formed by a cured matter of a resin composition that contains a curable epoxy compound, a compound containing fluorocarbon and a curing agent, with the content of the compound containing fluorocarbon being set in a range of 1 to 50 wt %. In the above-mentioned Patent Gazette, an ink supply port is formed through dry etching in which oxygen plasma is used.

In order to further improve the patterning property and also to improve the properties such as anti-ink properties and adhesion to the substrate, the inventors of the present invention carried out a pattern forming process in which a substance having a function for deactivating an acid and a fluorocarbon are contained in a cationic photopolymerizable epoxy resin having a cationic polymerizable epoxy resin and a cationic photopolymerization initiator. As a result, it was found that desired properties are not obtained, and that crater-shaped holes are observed on an interface (exposure interface) between the unexposed portion and the exposed portion in the depth direction, with the result that, to the contrary, the patterning property further deteriorates.

DISCLOSURE OF THE INVENTION

The present invention has been devised based upon the above-mentioned new findings, and its object is to provide a novel cationic photopolymerizable epoxy resin composition that can further improve patterning properties and also improve performance, such as anti-ink properties and adhesion to the substrate.

Moreover, another object of the present invention is to provide other related inventions such as a minute structural member made from the cured matter of the above-mentioned resin composition and the method for manufacturing such a member.

In order to achieve the above-mentioned objects, the cationic photopolymerizable epoxy resin composition of the present invention is characterized by comprising an epoxy resin, a cationic photopolymerization initiator, a inhibitor of cationic polymerization, a compound that has a fluoroalkyl group and also has a substituent at its terminal, with the substituent being allowed to cross-link react with the epoxy group of the epoxy resin, and a thermal cationic polymerization catalyst.

Moreover, the minute structural member of the present invention, which is a minute structural member formed on a substrate, is characterized in that the minute structural member is prepared as a cured matter of the above-mentioned cationic photopolymerizable epoxy resin composition.

The method for manufacturing a minute structural member of the present invention, which is a method for manufacturing a minute structural member formed on a substrate, is provided with the steps of: solvent-coating the cationic photopolymerizable epoxy resin composition on the substrate, patterning the cationic photopolymerizable epoxy resin composition by a photolithographic process, and thermally polymerizing the cationic photopolymerizable epoxy resin composition having been patterned by carrying out a heating process at a temperature of 150° C. or more.

By using the cationic photopolymerizable epoxy resin composition of the present invention, it becomes possible to form a pattern that has superior in anti-chemical properties and mechanical strength and is free from skirting even in the case of a thick film in a range from several microns to several tens of microns. Moreover, since an improved process margin for the dimensional stability is obtained, it becomes possible to stably form a minute structural member having a desirable pattern shape with good reproducibility.

BEST MODE FOR CARRYING OUT THE INVENTION

Figure 1A:
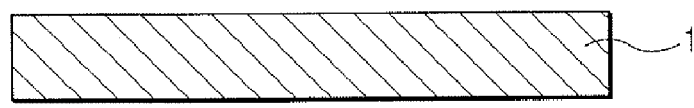
FIGS. 1A, 1B, 1C and 1D are explanatory drawings that schematically show a method for manufacturing a minute structural member according to the present invention.

A cationic photopolymerizable epoxy resin composition according to the present invention and a method for forming a minute structural member by using such an epoxy resin composition will be explained in detail.

(1) Explanation of Cationic Photopolymerizable Epoxy Resin Composition

Materials contained in the resin composition will be explained in detail.

Epoxy Resin

With respect to an epoxy resin forming a base, resins, such as a generally-known bisphenol A-type epoxy resin, a novolak type epoxy resin, and an epoxy resin having an oxycyclohexane skeleton, disclosed in Japanese Patent Application Laid-Open No. S60-161973, Japanese Patent Application Laid-Open No. S63-221121, Japanese Patent Application Laid-Open No. S64-9216 and Japanese Patent Application Laid-Open No. H02-140219, can be used, and in particular, a multifunctional epoxy resin with an oxycyclohexane skeleton having a structure indicated by the following general formula is preferably used.

General Formula 1

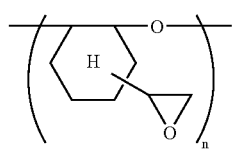

(in the formula, n indicates a positive integer)

General Formula 2

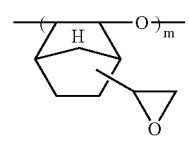

(in the formula, m indicates a positive integer)

Since the resulting epoxy resin exerts a high cationic polymerizable property and easily provides a high cross-linking density compared with bisphenol A type epoxy resins and novolak type epoxy resins, it becomes possible to obtain a cured matter that is superior in anti-chemical properties and mechanical strength. Moreover, since the resulting epoxy resin contains no aromatic ring in its structure, it is superior in light transmitting property and is suitably used as a thick film.

With respect to the epoxy equivalent of the epoxy resin, those compounds having an epoxy equivalent of 2000 or less, more preferably, 1000 or less, are preferably used. When the epoxy equivalent exceeds 2000, the cross-linking density is lowered during the curing reaction, with the result that Tg or the thermal deformation temperature of the cured matter is lowered, to sometimes cause problems with adhesion to the substrate and anti-chemical properties thereof. Moreover, in order to provide a good patterning property, the epoxy resin is preferably maintained in a solid state at normal temperature.

Cationic Photopolymerization Initiator

With respect to the photopolymerization initiator, onium salts, borate salts, triazine compounds, azo compounds, peroxides and the like may be used, and from the viewpoints of sensitivity, stability, reactivity and solubility, aromatic sulfonium salts and aromatic iodonium salts are preferably used. With respect to the aromatic sulfonium salts, for example, TPS-102, 103, 105, MDS-103, 105, 205, 305, DTS-102, 103, which are commercially available from Midori Kagaku Co., Ltd., and SP-170, 172, which are commercially available from Asahi Denka Co., Ltd., may be used, and with respect to the aromatic iodonium salts, DPI-105, MPI-103, 105, BBI-101, 102, 103, 105 and the like, which are commercially available from Midori Kagaku Co., Ltd., may be used. Among these, the initiator can be properly selected depending on the exposing wavelength to be used. Moreover, the amount of addition may be set to a desirable amount of addition so as to achieve target sensitivity and cross-linking density, and in particular, the amount of addition is desirably set in a range from 0.1 to 7 wt % with respect to the epoxy resin. Moreover, if necessary, for example, SP-100 and the like, which are commercially available from Asahi Denka Co., Ltd., may be added thereto as a wavelength enhancing agent. Moreover, a plurality of kinds of these may be mixed and used.

Cationic Photopolymerization Inhibitor

The cationic photopolymerization inhibitor refers to a substance that decreases the activity of an acid catalyst. In general, basic compounds are used. With respect to the basic substances, compounds that can serve as an acceptor for protons, that is, compounds having a non-covalent electron pair, may be used. More specifically, compounds containing atoms such as nitrogen, sulfur and phosphor atoms, may be used. Among these compounds, nitrogen-containing compounds are preferably used.

With respect to the nitrogen-containing compounds, in particular, amine compounds are preferably used. More specifically, examples thereof include: tertiary amines such as triphenyl amine, triethanol amine, triisopropanol amine, N,N-diethyl-3-aminophenol, N-ethyldiethanol amine, and 2-diethylaminoethanol amine; secondary amines such as diethanol amine, diisopropanol amine and N-methylbenzyl amine; pyrimidine compounds and derivatives thereof, such as pyrimidine, 2-amino pyrimidine, 4-amino pyrimidine and 5-amino pyrimidine; pyridine compounds and derivatives thereof, such as pyridine, methyl pyridine and 2,6-dimethyl pyridine; and aminophenols and derivatives thereof such as 2-aminophenol and 3-aminophenol.

The polymerization inhibition due to these amine compounds is preferably set at a low level so as not to impair the polymerizing reaction in the exposed portion and so as to sufficiently decrease the activity of an acid catalyst in an unexposed portion. For this reason, the basicity and the amount of the added amine compound are preferably adjusted so as to provide target sensitivity and resolution. In particular, compounds, such as tertiary amines, which are relatively weak bases and are more easily adjusted, are more preferable.

The addition amount of these basic substances is not particularly limited. However, since this amount depends on the basicity of the compound, it is preferably set in a range from 0.1 to 20 wt %, more preferably, from 0.5 to 4 wt %, of the content of the cationic photopolymerization initiator. When the amount is too small, sufficient effects are not obtained in an unexposed portion. Moreover, when the amount is too large, curing inhibition tends to occur in the exposed portion. In this case, although the problem can be solved by increasing the amount of exposure, this method causes degradation. Also, from the viewpoint of productivity, such a method is not practical.

Moreover, preferably, two or more kinds of these basic substances may be mixed with one another and used so as to provide various performances in a well-balanced manner.

Compound that has a Fluoroalkyl Group and also has a Substituent at its Terminal, with the Substituent being Allowed to Cross-Link React with the Epoxy Group The minute structural member, formed on a substrate to be processed by using the cationic photopolymerizable epoxy resin composition of the present invention, is produced on the premise that, different from conventional resists, the resulting member, as it is, is used as a constituent member, such as a part. Therefore, this member needs to be adjusted to also have properties, such as water resistance, anti-solvent properties and mechanical strength, depending on its purpose of use.

The cationic photopolymerizable epoxy resin composition of the present invention tends to inhibit a polymerization reaction in an exposed portion. Although the degree of the inhibition is slight, it results in the degradation in water resistance and anti-solvent properties. For this reason, the water resistance and anti-solvent properties are preferably improved by providing additives.

With respect to the method for improving the water-resistant property by adding additives to the epoxy resin, for example, Japanese Patent Application Laid-Open No. H08-290572 has disclosed a method in which a compound that has a fluoroalkyl group and also has a substituent at its terminal, with the substituent being allowed to cross-link react with the epoxy group, is added to a curable epoxy compound at an amount of 1 to 50 wt % so as to reduce the water absorption of the resin, and the water-resistant property can be improved by using the same method in the present invention as well. With respect to the specific example of the compound that has a fluoroalkyl group and also has a substituent at its terminal, with the substituent being allowed to cross-link react with the epoxy group, the following compounds are listed, although the embodiments of the present invention are not intended to be limited by these.

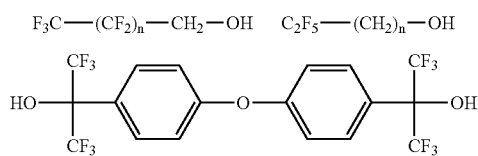

-continued

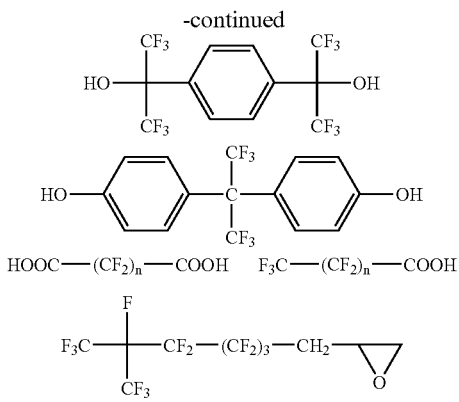

(in the formulas, n indicates a positive integer of 1 to 20)

The amount of addition may be desirably set according to target water-resistant property and anti-solvent properties, and in particular, the compound is preferably used in a range from 1 to 50 wt %, and, from the viewpoint of compatibility with resin, the range is preferably set from 1 to 30 wt %. Moreover, in order to enhance the mechanical strength, the cross-linking reaction is preferably accelerated by heating the compound; therefore, a compound, which has a hydroxide group and an epoxy group that exerts a high cross-linking reactivity at its terminal, is more preferably used. More preferably, two or more hydroxide groups are added to the terminal of the compound.

Thermal Cationic Polymerization Catalyst

In a system to which a compound that has a fluoroalkyl group and a substituent at its terminal, with the substituent being allowed to cross-link react with the epoxy group, is added, due to a difference in reactivity between the epoxy resin and this compound, deviations tend to occur in the cross-linking density of the exposed portion, resulting in a degradation of the anti-solvent properties and the patterning property on the exposed interface. In particular, since an inhibitor of cationic polymerization is contained in the resin of the present invention, the system is more susceptible to influences from a difference between cross-linking reaction rates and the resulting degradation in the anti-solvent properties and the patterning property. As a result, the compound does not sufficiently react and tends to deposit on the interface. For this reason, it is preferable to improve the cross-linking density by carrying out a post process, and, for example, a method that uses a thermal cationic polymerization catalyst in combination may be adopted. The cationic photopolymerization initiator is allowed to increase the cross-linking density through a heating process using the thermal cationic polymerization catalyst in combination. With respect to the thermal cationic polymerization catalyst, copper triflate (copper (II) trifluoromethane sulfonate) or ascorbic acid may be added and used. In particular, from the viewpoints of solubility and reactivity to the epoxy resin, copper triflate is effectively added, and by carrying out a heating treatment at a temperature of 150° C. or more, the cross-linking density of the minute structural member formed on a substrate to be processed by using the cationic photopolymerizable epoxy resin composition of the present invention can be greatly improved.

Since copper triflate functions as a thermal cationic polymerization initiator even when applied alone, an excessive amount thereof causes the polymerizing reaction of the epoxy resin to advance due to heat during a pre-baking process or PEB process. Moreover, presumably, the addition thereof accelerates the thermal cationic polymerizing reaction due to interaction with the aforementioned aromatic sulfonium salt, aromatic iodonium or the like; however, when the amount of addition is too small, the effects are not sufficiently exerted. With respect to the amount of addition of copper triflate, although not particularly limited since the effects differ depending on the kind of the photopolymerization initiator, it is preferably set in a range from 0.01 to 50 wt %, to the content of the cationic photopolymerization initiator.

Other Additives

Various additives may be used with the cationic photopolymerizable epoxy resin composition of the present invention so as to increase the cross-linking density, improve the coating property, water-resistant property and anti-solvent properties, add the flexibility and also improve the adhesion to the substrate.

For example, a silane coupling agent may be added so as to improve the adhesion to the substrate.

(2) Minute Structural Member and Method for Manufacturing the Same

Referring to FIGS. 1A to 1D and FIGS. 2A and 2B, the following description will briefly explain the minute structural member of the present invention and a method for manufacturing the same.

FIGS. 1A to 1D are explanatory drawings that schematically show cross-sectional views of a method for manufacturing the minute structural member according to the present invention.

Figure 1B:
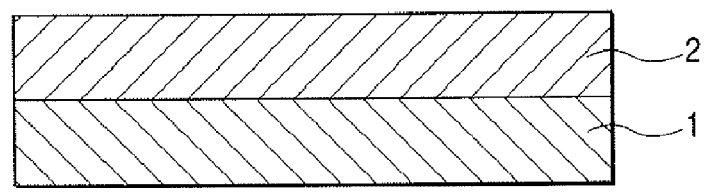
Figure 1C:
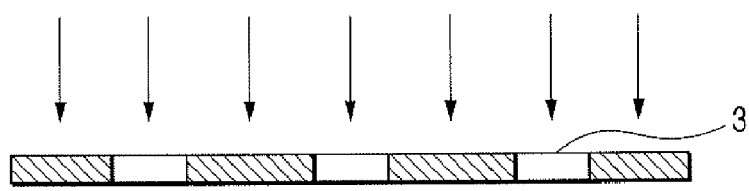
Figure 1C:
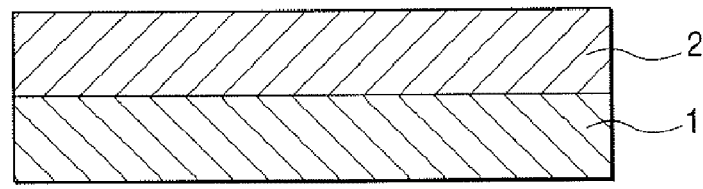
Figure 1D:
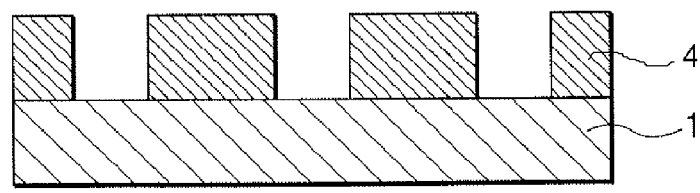

In the present invention, first, a substrate 1 on which a minute structural member is to be formed, as shown in FIG. 1A, is prepared. The substrate is formed by using a material such as silicon and glass. Next, as shown in FIG. 1B, the aforementioned cationic photopolymerizable epoxy resin composition is solvent-coated on the surface of this substrate so that a resin layer 2 of the cationic photopolymerizable epoxy resin composition is formed. Next, as shown in FIG. 1C, the substrate 1 bearing the resin layer 2 is exposed by using a mask 3 and developed so that the resin layer 2 is patterned. Thereafter, the resulting substrate is subjected to a heating process at a temperature of 150° C. or more so that, as shown in FIG. 1D, a fine structural member 4 made of a cured matter of the cationic photopolymerizable epoxy resin composition is obtained.

Figure 2A:
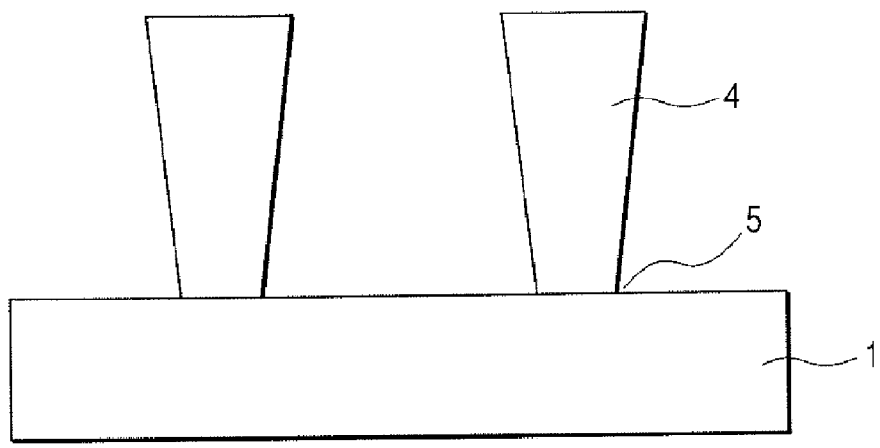
FIGS. 2A and 2B are schematic cross-sectional views that explain boring and skirting that occur in a minute structural member formed by using the conventional technique.
Figure 2B:
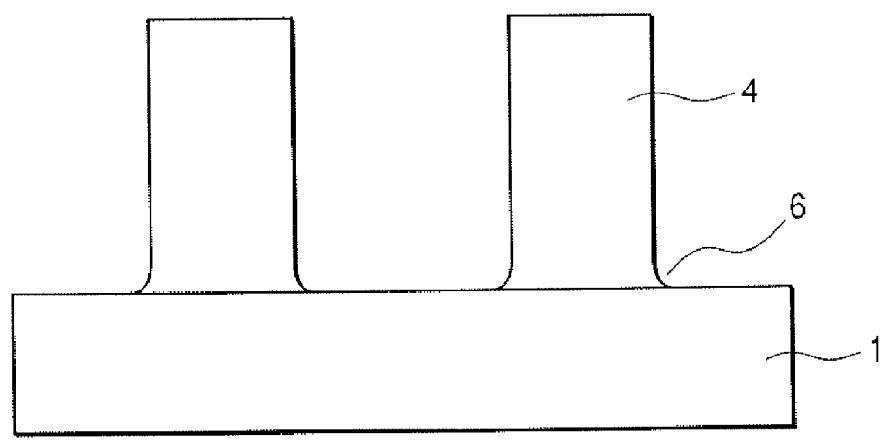

Here, when a minute structural member is formed by using a generally-used negative resist through a method shown in FIGS. 1A to 1D, without using the cationic photopolymerizable epoxy resin composition of the present invention, wedge shapes that narrow toward the substrate tend to appear, for example, when the dose the of exposure becomes insufficient, although the appearance differs depending on the exposing conditions and the composition of the resist. Moreover, for example, when the dose of the exposure becomes excessive, skirting portions tend to appear. When the minute structural pattern is used for manufacturing a device having a minute structure, such as ink jet recording heads of various types, these phenomena adversely affect the performance. More specifically, when the dose of the exposure becomes insufficient at a lower portion of the substrate, or when the diffusion of an acid by PEB becomes insufficient, a boring portion 5 tends to appear at the lower portion of the pattern, as shown in FIG. 2A, resulting in a pattern having a reverse trapezoidal shape. Here, when the dose of the exposure is increased so as to obtain a rectangular pattern, the unexposed portion is allowed to react by light reflected from the substrate 1, a skirting portion 6, as shown in FIG. 2B, is generated. Moreover, when residual matter is generated during the processes from PEB to the developing, a similar skirting portion is also generated due to diffusion of the acid in the unexposed portion.

However, when the cationic photopolymerizable resin composition of the present invention is used, such problems with the patterning are not raised, and performances, such as anti-ink properties and adhesion to the substrate, can be improved.

These points will be explained below in detail by using specific examples and comparative examples.

EXAMPLES

Examples of the present invention are shown below:

First, a cationic photopolymerizable epoxy resin composition 1, indicated below, was prepared.

Resin Composition 1

| | |
|---|---|
| Epoxy resin: EHPE-3150 (made by Daicel Chemical Industries Ltd.) | 100 parts by weight |
| Cationic photopolymerization initiator: SP-170 (made by Asahi Denka Co., Ltd.) | 1 part by weight |
| Inhibitor of cationic polymerization: Triethanol amine | refer to Table |
| Compound that has a fluoroalkyl group and also has a substituent at its terminal, with the substituent being allowed to cross-link react with the epoxy group: compound 1 shown below | refer to Table |
| Thermal cationic polymerization catalyst: Copper (II) trifluoromethane sulfonate (Copper triflate) | refer to Table |

Compound 1

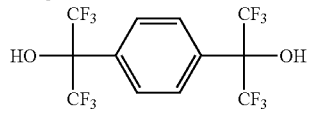

The above-mentioned composition was dissolved in methylisobutyl ketone to prepare samples of a cationic photopolymerizable epoxy resin composition (refer to the following Table). Each of the samples was applied to an Si substrate by using a spin coat method, and pre-baked at 90° C. for 180 seconds to form a film thickness of 20 μm. Next, an exposing process was carried out thereon to form a line and space pattern having a length of 1 cm and a width of 5 μm by using a KrF stepper, and after a PEB process had been carried out at 120° C. for 90 seconds, the resulting pattern was developed by using methylisobutyl ketone, and subjected to a rinsing process with isopropyl alcohol. The cross section of resulting line and space pattern was observed by a scanning electron microscope to confirm the presence or absence of skirting and the state of the exposed interface, and the anti-solvent test was carried out and the degrees of swelling were compared, as described below. The results are shown in the following Table.

Here, the conditions of the respective tests and evaluations were carried out as described below:

(1) With respect to the skirting and the state of the exposed interface, the substrate was cut at the resulting line and space portion, and the cross section thus cut was observed.

(2) With respect to the exposed interface, a smooth interface was evaluated as ○, and an interface on which roughened portions and holes were observed was evaluated as ×.

(3) With respect to the anti-solvent properties, a plurality of substrates, which were formed under the same conditions, were prepared in a separate manner from the substrates previously used for evaluating the skirting and the state of exposure interface, and after each of the substrates had been subjected to the following test 1 and test 2, the resulting pattern was observed by using an optical microscope.

Test 1: The substrate was boiled in a 2.38 wt % TMAH aqueous solution for one hour.

When one portion of the interface between the substrate and the pattern had a peel with the result that interference fringes were observed on one portion of the substrate, the resulting substrate was evaluated as Δ; when interference fringes were observed over the entire interface between the substrate and the pattern, the resulting substrate was evaluated as ×; and when no interference fringes were observed, the resulting substrate was evaluated as ○.

Test 2: The substrate was immersed into an NMP maintained at 80° C.

When one portion of the interface between the substrate and the pattern had a peel with the result that interference fringes were observed on one portion of the substrate, the resulting substrate was evaluated as Δ; when interference fringes were observed over the entire interface between the substrate and the pattern, the resulting substrate was evaluated as ×; and when no interference fringes were observed, the resulting substrate was evaluated as ○.

(4) With respect to the degree of swelling, after the completion of the above-mentioned test 1, the gap between the line and space was measured so that the rate of change in the pattern width was found. With respect to the measured values, those samples having the rate of change in the pattern width that was virtually in the same level as the rate of change in the pattern width of sample No. 1 (those having a great degree of swelling) were evaluated as ×; those samples having the rate of change in the pattern width that was approximately 30% smaller than the rate of change in the pattern width of sample No. 1 were evaluated as Δ; and those samples having the rate of change that was approximately 40% or more smaller than that were evaluated as ○.

epoxy group, to the cationic photopolymerizable epoxy resin, it was possible to improve anti-swelling properties (samples 3 to 7).

(3) When the compound and triethanol amine serving as the inhibitor of cationic polymerization were simultaneously added (samples 3 and 4), although the anti-swelling properties could be improved, crater-shaped holes were observed on the exposure interface. In contrast, when copper triflate was further added thereto (samples 5 to 7), no holes on the interface were observed to provide a superior interface state and superior anti-swelling properties.

(4) As described above, in samples 5 to 7 relating to the present examples, it was confirmed that by adding copper triflate to the cationic photopolymerizable epoxy resin containing the compound that had a fluoroalkyl group and also had a substituent at its terminal, with the substituent being allowed to cross-link react with the epoxy group, and the inhibitor of cationic polymerization, it was possible to obtain a cured matter that was superior in any of properties, such as a water-resistant property, anti-solvent properties and patterning properties.

The reason that, in samples 3 and 4, the crater-shaped holes were observed on the interface (exposure interface) between the unexposed potion and the exposed portion in the depth direction was presumably because the disadvantage of curing inhibition caused by the inhibitor of cationic polymerization was accelerated by the compound that had a fluoroalkyl group and also had a substituent at its terminal, with the substituent being allowed to cross-link react with the epoxy group. When such a crater-shaped hole is generated at the discharge portion of an ink jet head, the discharging direction might be changed and satellites and mists might increase; however, according to the present invention, since a smooth interface is formed, it is possible to provide an ink jet head that can maintain a desirable discharging state. Moreover, with respect to the swelling, supposing that a swelling as shown in Table is generated at the

TABLE

| NO | Triethanolamine (parts by weight) | Compound 1 (parts by weight) | Coppertriflate (parts by weight) | Dose of exposure (J/m^2) | Patterning property (skirting) | Patterning property (interface state) | Anti-solvent properties (Test1) | Anti-solvent properties (Test 2) | Degree of swelling |
|---|---|---|---|---|---|---|---|---|---|
| 1 | 0 | 0 | 0 | 300 | Presence | ○ | Δ | Δ | — |
| 2 | 0 | 20 | 0 | 300 | Presence | ○ | Δ | ○ | ○ |
| 3 | 0.02 | 10 | 0 | 1000 | Absence | X | Δ | X | Δ |
| 4 | 0.02 | 20 | 0 | 1000 | Absence | X | Δ | Δ | ○ |
| 5 | 0.02 | 10 | 0.002 | 1000 | Absence | ○ | Δ | ○ | Δ |
| 6 | 0.02 | 20 | 0.002 | 1000 | Absence | ○ | ○ | ○ | ○ |
| 7 | 0.015 | 15 | 0.015 | 800 | Absence | ○ | ○ | ○ | ○ |

In the present examples, the following effects were observed.

(1) It was confirmed that by adding triethanol amine that served as an inhibitor of cationic polymerization, it was possible to form a pattern that was free from skirting (samples 3 to 7).

(2) It was confirmed that by adding the compound that had a fluoroalkyl group and also had a substituent at its terminal, with the substituent being allowed to cross-link react with the discharge port, the change in discharged volume is proportional to the $3^{rd}$ power thereof so that the deviation in the amount of discharge is proportional to the $1.5^{th}$ power of the amount of swelling; thus, the deviation in the amount of discharge due to swelling, which conventionally corresponds to 30% or more of the amount of discharge, can be reduced to approximately 20% to 10% thereof.

This effect is obtained because the addition of copper triflate makes it possible to improve the cross-linking density between the compound that has a fluoroalkyl group and also has a substituent at its terminal, with the substituent being allowed to cross-link react with the epoxy group, and the epoxy resin.

The cationic photopolymerizable epoxy resin composition of the present invention as described above is preferably applied to a flow-path forming material for an ink jet head as described above. With respect to a specific method for manufacturing the head in which the material of the present invention is used, for example, manufacturing methods, as disclosed in Japanese Patent No. 3143307 and Japanese Patent No. 3143308, in which a photosensitive resin material is used to form a hollow structural member so as to prepare an ink flow path, are listed. Moreover, the cationic photopolymerizable epoxy resin composition of the present invention, which has superior anti-chemical properties and mechanical strength as well as good patterning properties, can be applied to various other fields in addition to the above-mentioned ink jet heads.

This application claims priority from Japanese Patent Application No. 2004-190478 filed Jun. 28, 2004, which is hereby incorporated by reference herein.

The invention claimed is:

1. A cationic photopolymerizable epoxy resin composition comprising:
   an epoxy resin;
   a cationic photopolymerization initiator;
   at least one amine compound selected from the group consisting of triethanol amine, triisopropanol amine, N-ethyldiethanol amine, and 2-diethylaminoethanol amine, diisopropanol amine, N,N-diethyl-3-aminophenol, and diethanol amine;
   a compound that has a fluoroalkyl group and at least two hydroxyl groups; and
   a thermal cationic polymerization catalyst.

2. The cationic photopolymerizable epoxy resin composition according to claim 1, wherein the epoxy resin is a multifunctional epoxy resin having an oxycyclohexane skeleton.

3. The cationic photopolymerizable epoxy resin composition according to claim 2, wherein the epoxy resin has a structure represented by general formula 1

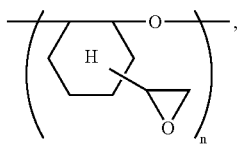

General formula 1 wherein n is a positive integer.

4. The cationic photopolymerizable epoxy resin composition according to claim 1, wherein the epoxy resin has an epoxy equivalent of 2000 or less.

5. The cationic photopolymerizable epoxy resin composition according to claim 4, wherein the epoxy resin is a solid substance at normal temperature.

6. The cationic photopolymerizable epoxy resin composition according to claim 1, wherein the cationic photopolymerization initiator is at least one material selected from the group consisting of an aromatic sulfonium salt and an aromatic iodonium salt.

7. The cationic photopolymerizable epoxy resin composition according to claim 1, wherein the at least one amine compound is contained in a range from 0.1 wt % to 20 wt % with respect to the cationic photopolymerization initiator.

8. The cationic photopolymerizable epoxy resin composition according to claim 1, wherein an amount of the compound that has the fluoroalkyl group and at least two hydroxyl groups is set in a range from 1 wt % to 50 wt % with respect to the epoxy resin.

9. The cationic photopolymerizable epoxy resin composition according to claim 1, wherein the thermal cationic polymerization catalyst is copper triflate.

10. The cationic photopolymerizable epoxy resin composition according to claim 1, wherein the thermal cationic polymerization catalyst is contained in a range from 0.01 wt % to 50 wt % with respect to the cationic photopolymerization initiator.

11. A minute structural member formed on a substrate and comprising a cured cationic photopolymerizable epoxy resin composition according to claim 1.

12. The cationic photopolymerizable epoxy resin composition according to claim 1, wherein the epoxy resin has a structure represented by general formula 2

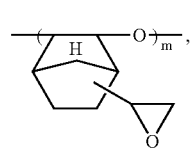

General formula 2 wherein m is a positive integer.

13. The cationic photopolymerizable epoxy resin composition according to claim 1, wherein the at least one amine compound is contained in a range from 0.5 wt % to 4 wt % with respect to the cationic photopolymerization initiator.

14. The cationic photopolymerizable epoxy resin composition according to claim 1, wherein the at least one amine compound is triethanol amine.

15. A method for manufacturing a minute structural member formed on a substrate, comprising the steps of:
   solvent-coating the cationic photopolymerizable epoxy resin composition on the substrate, the cationic photopolymerizable epoxy resin composition comprising:
      an epoxy resin;
      a cationic photopolymerization initiator;
      at least one amine compound selected from the group consisting of triethanol amine, triisopropanol amine, N-ethyldiethanol amine, and 2-diethylaminoethanol amine, diisopropanol amine, N,N-diethyl-3-aminophenol, and diethanol amine,
      a compound that has a fluoroalkyl group and at least two hydroxyl groups, and
      a thermal cationic polymerization catalyst;
   patterning the cationic photopolymerizable epoxy resin composition through a photolithographic process; and
   carrying out a heating process on the cationic photopolymerizable epoxy resin composition that has been patterned at a temperature of 150° C. or more so as to be thermally polymerized.

16. The method according to claim 15, wherein the at least one amine compound is contained in a range from 0.5 wt % to 4 wt % with respect to the cationic photopolymerization initiator.

17. The method according to claim 15, wherein the at least one amine compound is triethanol amine.

* * * * *